US008912475B2

(12) United States Patent
Smith et al.

(10) Patent No.: US 8,912,475 B2
(45) Date of Patent: Dec. 16, 2014

(54) OPTICAL SENSING SYSTEM WITH A PHASE SENSITIVE AMPLIFIER AND ASSOCIATED METHODS

(75) Inventors: Kevin H. Smith, W. Melbourone, FL (US); Christopher P. Visone, W. Melbourne, FL (US); Ryan T. Glasser, Rockville, MD (US); Michael L. Silver, Palm Bay, FL (US); Lee M. Burberry, W. Melbourne, FL (US); Peter A. Wasilousky, Indialantic, FL (US)

(73) Assignee: Harris Corporation, Melbourne, FL (US)

( * ) Notice: Subject to any disclaimer, the term of this patent is extended or adjusted under 35 U.S.C. 154(b) by 597 days.

(21) Appl. No.: 13/302,083

(22) Filed: Nov. 22, 2011

(65) Prior Publication Data
US 2013/0126701 A1 May 23, 2013

(51) Int. Cl.
*H03F 3/08* (2006.01)
(52) U.S. Cl.
CPC .......................................... *H03F 3/08* (2013.01)
USPC ........................................... 250/206; 359/333
(58) Field of Classification Search
USPC ............ 250/206, 214.1, 214 R; 359/330–334
See application file for complete search history.

(56) References Cited

U.S. PATENT DOCUMENTS

| | | | |
|---|---|---|---|
| 6,414,786 B1 * | 7/2002 | Foursa | 359/334 |
| 6,833,947 B2 * | 12/2004 | Cussat-Blanc et al. | 359/334 |
| 7,245,422 B2 * | 7/2007 | Tanaka | 359/334 |
| 7,483,203 B2 | 1/2009 | McKinstrie | 359/333 |
| 7,724,421 B2 | 5/2010 | McKinstrie | 359/333 |
| 2007/0216994 A1 | 9/2007 | McKinstrie | 359/341.31 |

OTHER PUBLICATIONS

Matthys et al. "Phase-sensitive optical amplifier" J. Opt. Soc. Am., vol.. 70, No. 3, Mar. 1980.
Tong et al., "Towards Ultrasensitive Optical Links Enabled by Low-Noise Phase-Sensitive Amplifiers", October 6, 2010, Abstract Only, 1 pg.

* cited by examiner

*Primary Examiner* — Seung C Sohn
(74) *Attorney, Agent, or Firm* — Allen, Dyer, Doppelt, Milbrath & Gilchrist, P.A.

(57) ABSTRACT

An optical sensing system includes a transmitter configured to transmit a free-space optical signal toward a target, and a receiver configured to receive a reflected free-space optical target signal from the target. The receiver includes a phase sensitive amplifier (PSA), a homodyne detector coupled downstream from the PSA, and a controller configured to adjust a phase of the PSA based upon the homodyne detector.

27 Claims, 5 Drawing Sheets

OPTICAL SENSING SYSTEM WITH A PHASE SENSITIVE AMPLIFIER AND ASSOCIATED METHODS

GOVERNMENT LICENSE RIGHTS

This invention was made with government support under Government Contract No. FA8750-09-C-0194 awarded by the National Institute of Standards and Technology (NIST). The U.S. Government may have certain rights in the invention.

FIELD OF THE INVENTION

The present invention relates to the field of standoff sensing, and more particularly, to an optical sensing system and method using a phase sensitive amplifier (PSA).

BACKGROUND OF THE INVENTION

Optical sensing systems may use optical amplifiers to compensate for signal attenuation. Two types of optical amplifiers are a phase insensitive amplifier (PIA) and a phase sensitive amplifier (PSA).

An example PIA is an erbium-doped fiber amplifier. An advantage of a PIA is that signal gain is produced independent of the signal phase. This means that the phase of the PIA pump does not need to be locked to a local oscillator signal. However, a PIA adds noise to the optical signal being amplified.

In contrast, with coherent detection, a PSA may advantageously amplify the optical signal without adding noise. However, to realize noiseless amplification, the phase of the PSA pump needs to be locked to a local oscillator signal.

One approach for using a PSA is disclosed in U.S. Published Patent Application No. 2007/0216994, wherein a PSA is produced by degenerate four-wave mixing (FWM) in a randomly-birefringent fiber (RBF). In particular, the PSA includes a non-linear optical fiber, a first pump to input polarized electromagnetic energy having a first polarization angle and a first wavelength into the optical fiber, and a second pump to input polarized electromagnetic energy having a second polarization angle and a second wavelength into the optical fiber. An optical communication signal source inputs into the optical fiber a polarized optical communication signal having a third polarization angle between the first and second polarization angles and a third wavelength between the first and second wavelengths. Vector FWM near the zero-dispersion frequency (ZDF) of the RBF produces phase-sensitive amplification, which makes it easier to phase-lock pumps with similar frequencies, as produced by a single laser and phase modulator.

In other embodiments of an optical sensing system interfacing with an optical fiber, phase locking of a PSA has been performed via injection locking techniques. When the phase and amplitude of the optical signal being amplified are known, various phase locking and carrier extraction schemes may be used to support a PSA. These schemes allow the phase of the optical pump source associated with the PSA to be phase-locked to a local oscillator signal.

For free-space optical signals, PSAs have also been used in imaging and light detection and ranging (LIDAR) applications using direct detection, but the PSA is operated in such a way that the amplification is not noiseless. Knowledge of the phase is not necessary in direct detection. However, there is a need to be able to operate a PSA with coherent detection so that amplification may be substantially noiseless.

SUMMARY OF THE INVENTION

In view of the foregoing background, it is therefore an object of the present invention to provide an optical sensing system that includes a phase sensitive amplifier (PSA) to amplify a free-space optical signal with an unknown phase and amplitude to provide substantially noiseless amplification.

This and other objects, features, and advantages in accordance with the present invention are provided by an optical sensing system comprising a transmitter configured to transmit a free-space optical signal toward a target, and a receiver configured to receive a reflected free-space optical target signal from the target. The receiver includes a PSA, a homodyne detector coupled downstream from the PSA, and a controller configured to adjust a phase of the PSA based upon the homodyne detector.

The PSA advantageously provides substantially noise-free amplification of the reflected free-space optical target signal. The PSA may be configured to periodically amplify the reflected free-space optical target signal in an amplifying quadrature, and periodically de-amplify the reflected free-space optical target signal in a de-amplifying quadrature by shifting a frequency of the optical target signal relative to a frequency of the PSA pump. Measuring the amplified quadrature of the PSA improves the signal-to-noise ratio.

To ensure that the amplified quadrature is being measured, the phase of the PSA is locked to a local oscillator signal. The optical sensing system may further comprise a combiner configured to combine the reflected free-space optical target signal and an optical probe signal to provide a combined optical signal. The optical probe signal has a known phase and amplitude, and is offset in frequency from the reflected free-space optical target signal and a local oscillator signal. This allows the optical probe signal to be discriminated from the reflected free-space optical target signal in the frequency spectral domain. The phase of the PSA may then be adjusted relative to the local oscillator signal so that an amplitude of the optical probe signal in the frequency spectral domain may be maximized. This may ensure that the reflected free-space optical target signal is being measured in the amplified quadrature of the PSA.

Another aspect is directed to a method for operating an optical sensing system as described above. The method may comprise transmitting a free-space optical signal toward a target, and receiving a reflected free-space optical target signal from the target.

The method may further comprise combining the reflected free-space optical target signal and an optical probe signal to provide a combined optical signal, with the optical probe signal being offset in frequency from a frequency of the reflected free-space optical target signal. The combined optical signal may be amplified with a PSA. The amplified combined optical signal and a local oscillator signal may be detected using a homodyne detector coupled downstream from the PSA. A power level of the combined optical signal may be measured, and a phase of the PSA may be adjusted relative to the local oscillator signal based upon the measured power level of the optical probe signal.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
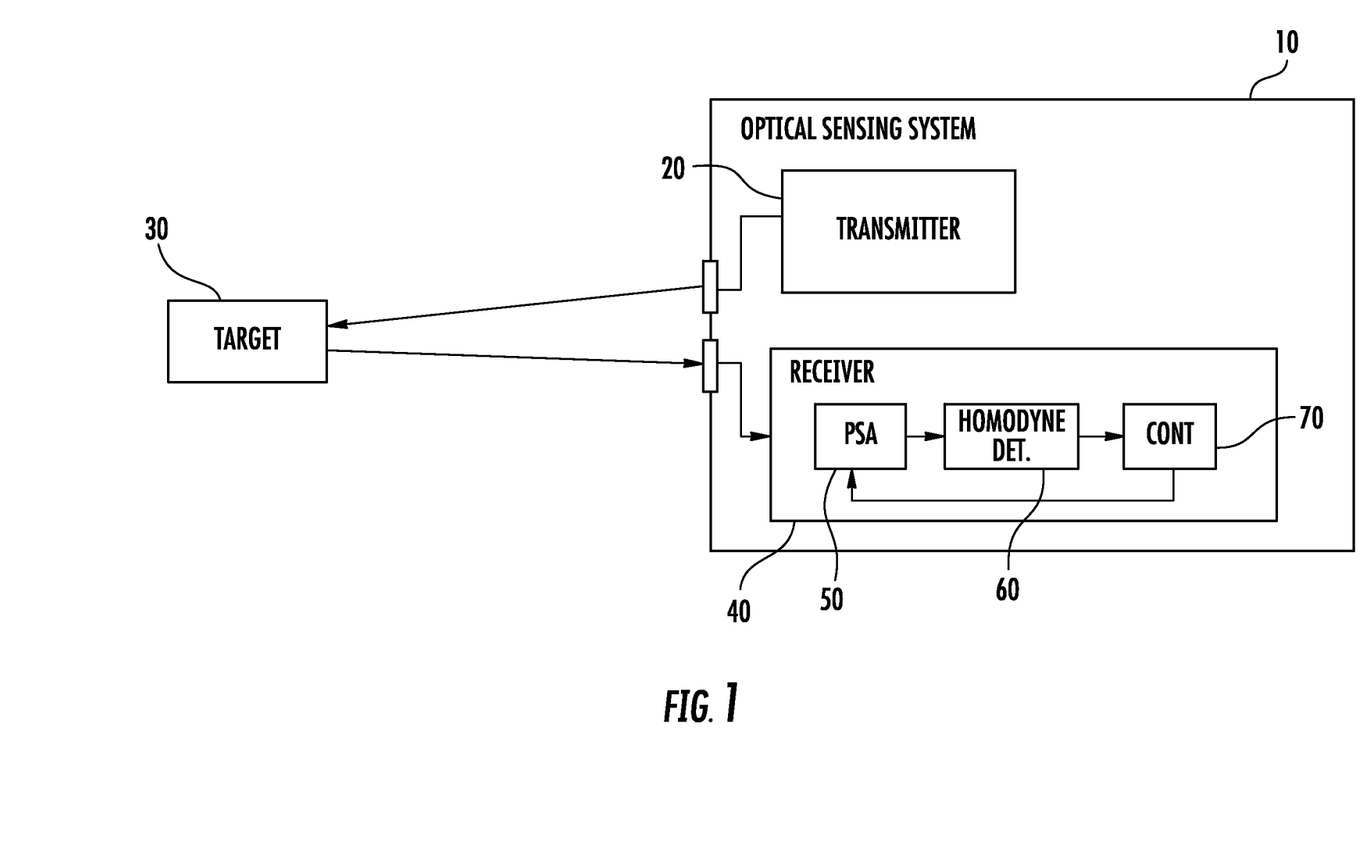
FIG. 1 is schematic block diagram of an optical sensing system in accordance with the present invention.

Referring initially to FIG. 1, an optical sensing system 10 includes a transmitter 20 and a receiver 40. The transmitter 20 is configured to transmit a free-space optical signal toward a target 30. The receiver 40 is configured to receive the free-space optical target signal reflected from the target 30. The receiver 40 includes a phase sensitive amplifier (PSA) 50, a homodyne detector 60 coupled downstream from the PSA, and a controller 70 configured to adjust a phase of the PSA based upon the homodyne detector.

The optical sensing system 10 may be configured as a light detection and ranging (LIDAR) system, for example. A LIDAR system can measure the distance to, or other properties of a target by illuminating the target with light, often using pulses from a laser. LIDAR technology has applications in geomatics, archaeology, geography, geology, geomorphology, seismology, forestry, remote sensing and atmospheric physics, as well as in airborne laser swath mapping (ALSM), laser altimetry and LIDAR contour mapping. As another example, the optical sensing system 10 may be configured as a laser detection and ranging (LADAR) system. A LADAR system uses laser beams to scan and process the signals echoed from targets, to create a virtual picture of the area. In other words, the optical sensing system 10 is applicable to standoff sensing.

The PSA 50 advantageously provides substantially noise-free amplification of the reflected free-space optical target signal. The PSA 50 is configured to periodically amplify the reflected free-space optical target signal in an amplifying quadrature, and periodically de-amplify the reflected free-space optical target signal in a de-amplifying quadrature by shifting a frequency of the optical target signal relative to a frequency of the PSA pump. Measuring the amplified quadrature of the PSA 50 improves the signal-to-noise ratio. As readily understood by those skilled in the art, the signal-to-noise ratio is improved if there is a loss (i.e., less then unity detection efficiency) between the PSA 50 and the homodyne detector 60. To ensure that the amplified quadrature is being measured, the phase of the PSA 50 is locked to a local oscillator signal.

Since the reflected free-space optical target signal has an unknown phase and amplitude, it is difficult to determine the phase relationship between the local oscillator signal and the PSA 50. As will be explained in greater detail below, an optical probe signal is collinearly passed with the reflected free-space optical target signal through the PSA 50. The optical probe signal has a known phase and amplitude, and is offset in frequency from the reflected free-space optical target signal and the local oscillator signal. This allows the optical probe signal to be discriminated from the reflected free-space optical target signal in the frequency spectral domain. The phase of the PSA 50 may then be adjusted relative to the local oscillator signal so that an amplitude of the optical probe signal in the frequency spectral domain is maximized, for example. This ensures that the reflected free-space optical target signal is being measured in the amplified quadrature of the PSA 50.

Figure 2:
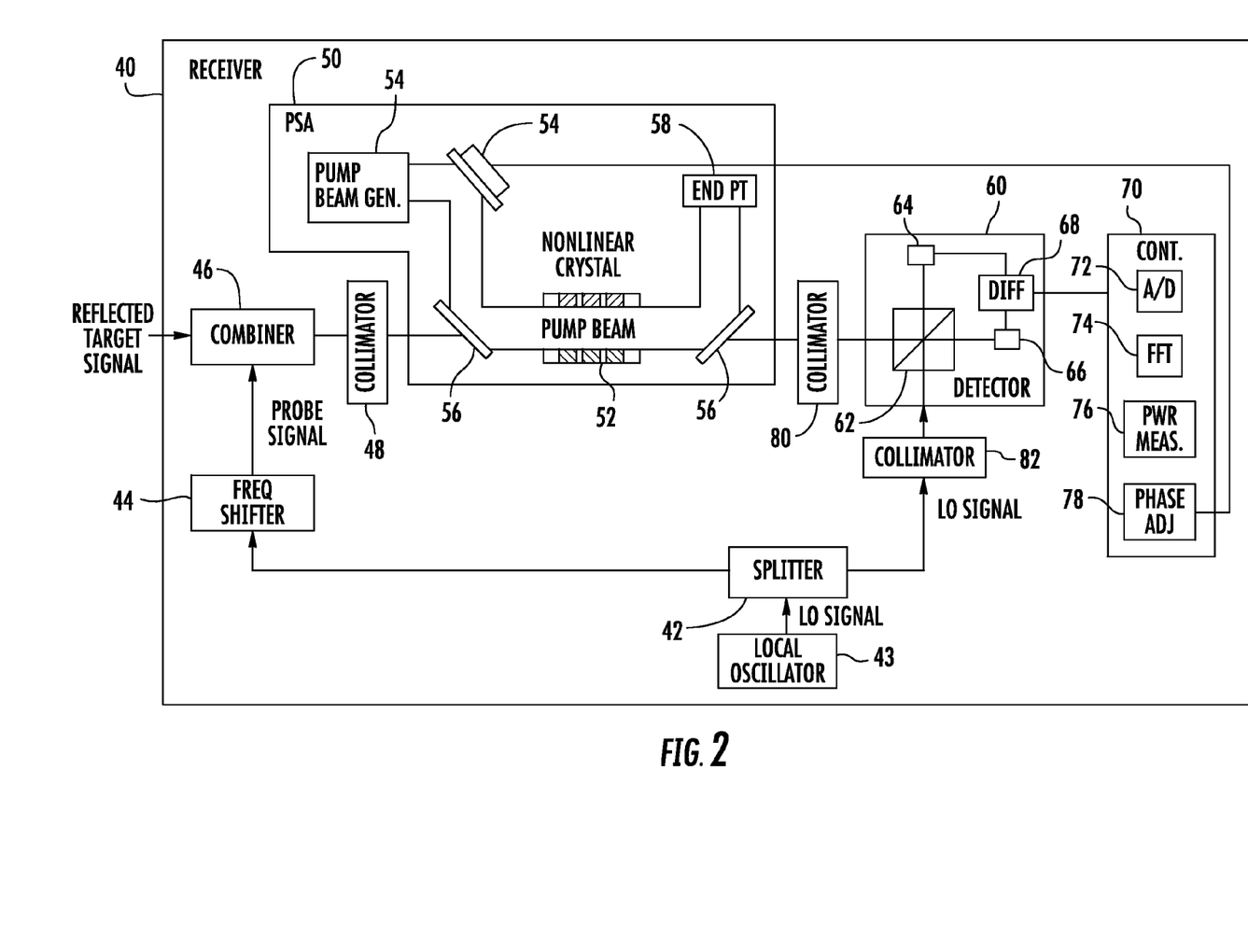
FIG. 2 is a more schematic detailed block diagram of the receiver shown in FIG. 1.

Referring now additionally to FIG. 2, the receiver 40 includes an optical splitter 42 that receives the local oscillator signal from a local oscillator 43. Alternatively, the local oscillator signal may be generated by the transmitter 20 and provided to the optical splitter 42. The local oscillator signal may have a wavelength of 1550 nm, for example. The optical sensing system 10 is not limited to this wavelength, as will be appreciated by those skilled in the art. Depending on the intended application of the optical sensing system 10, other wavelengths are readily acceptable.

The optical splitter 42 splits the local oscillator signal into two local oscillator signals. A first local oscillator signal is provided to the homodyne detector 60, and a second local oscillator signal is provided to a frequency shifter 44. The frequency shifter 44 offsets a frequency of the local oscillator signal to generate the optical probe signal. The frequency shift may be about 10 kHz, for example.

The optical probe signal is then provided to a combiner 46. The combiner 46 combines the optical probe signal with the reflected free-space optical target signal to generate a combined optical signal. The combined optical signal is provided through a collimator 48 to the PSA 50 for amplification. The reflected free-space optical signal is also offset in frequency from the local oscillator signal. However, this offset is done within the transmitter 20 prior to transmission of the optical signal, or inside the receiver 40 before the reflected free-space optical target signal reaches the combined 46. The frequency shift may be about 50 kHz, for example.

The PSA 50 includes a non-linear crystal 52, as shown in the illustrated embodiment. The combined optical signal passes through the non-linear crystal 52 along with a pump beam generated by a pump beam generator 54. The pump beam is a periodic signal at the second harmonic of the local oscillator frequency that excites the non-linear crystal 52. This excitement causes the combined optical signal to be amplified when in the amplifying quadrature, and de-amplified in the de-amplifying quadrature. The PSA 50 provides through a collimator 80 a periodically amplified/de-amplified combined optical signal to the homodyne detector 60.

The homodyne detector 60 is configured as a balanced homodyne detector, and includes a beam splitter 62 that receives the periodically amplified/de-amplified combined optical signal from the PSA 50. The homodyne detector 60 also receives the local oscillator signal from a collimator 82 which is downstream from the optical splitter 42.

The beam splitter 62 within the homodyne detector 60 splits the combined optical signal between a first photodiode 64 and a second photodiode 66. The beam splitter 62 also splits the local oscillator signal between the first photodiode 64 and the second photodiode 66. Each photodiode 64, 66 generates a detected signal that is proportional to the light received from the beam splitter 62. The detected signals from the photodiodes 64, 66 are then provided to a difference module 68. The difference module 68 provides an analog difference signal to the controller 70.

Figure 3:
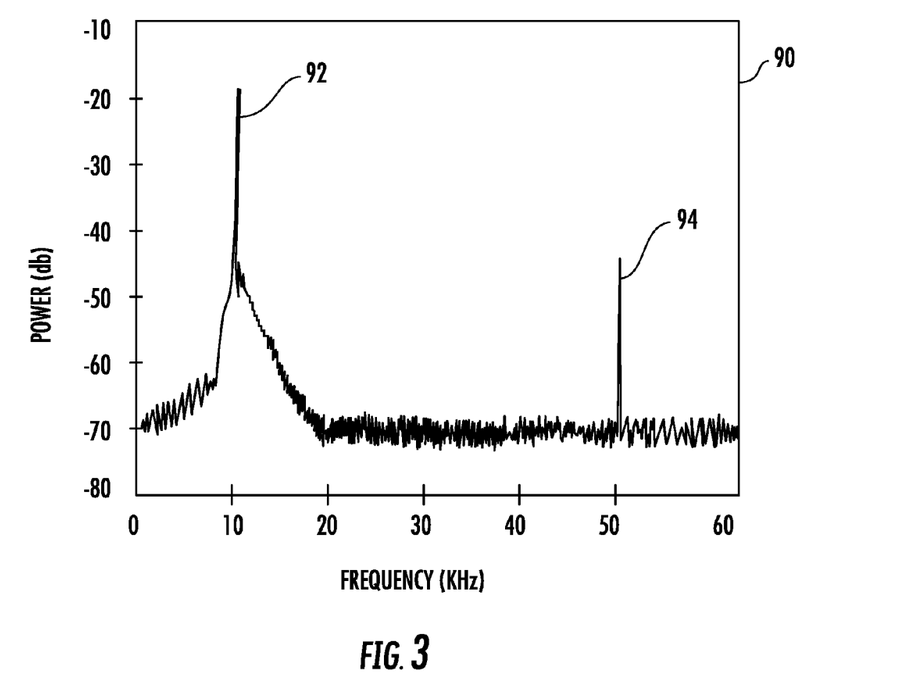
FIG. 3 is a frequency spectrum plot of the optical probe signal and the reflected free-space optical signal in accordance with the present invention.

The controller 70 includes an analog-to-digital converter 72 to convert the analog difference signal to a digital difference signal. A fast Fourier transform module 74 provides a frequency spectrum plot 90 of the digital difference signal, as illustrated in FIG. 3. Since the optical probe signal and the reflected free-space optical target signal traverse a common path from the PSA 50 to the homodyne detector 60, they accumulate the same phase over this path. A power measurement module 76 measures a power level of the optical probe signal, and a phase adjustment module 78 adjusts the phase of the PSA relative to the local oscillator signal based on the measured power level. As an alternative, the controller 70 may receive the detected signal directly from one of the photodiodes 64 or 66, and still generate the frequency spectrum plot 90 to adjust the phase of the PSA relative to the local oscillator signal based on the measured power level.

In the illustrated frequency spectrum plot 80, the optical probe signal 92 is at 10 kHz, and the reflected free-space optical target signal 94 is at 50 kHz. Since the amplitude of the optical probe signal 92 is known, the phase of the PSA 50 may be adjusted relative to the local oscillator signal to maintain maximization of the power level of the optical probe signal 92.

In one embodiment, the phase of the PSA 50 is adjusted by the phase adjustment module 78 within the controller 70 by adjusting a piezoelectric transducer (PZT) mirror 54 in the path of the pump beam. The path of the pump beam from the PZT mirror 54 is then directed by a pair of mirrors 56 through the non-linear crystal 52 to an end point 58, as shown in the illustrated embodiment. Other embodiments for adjusting the phase of the PSA 50 are readily available, such as using a phase modulator or adjusting a phase of the local oscillator signal. Measurement of the reflected free-space optical target signal by the detector 60 when the optical probe signal is at a maximum power level means that the reflected free-space optical target signal is being optimally measured. The measured reflected free-space optical target is substantially noiselessly amplified when the PSA 50 and the local oscillator signal are "phase locked."

A mathematical representation of the phase relationships between the various signals will now be discussed. As noted above, a challenge inherent in using a receiver 40 with a PSA 50 and a homodyne detector 60 is ensuring that the detector 70 measures the amplified quadrature of the PSA and not the de-amplified quadrature. To address this problem, the optical probe signal and the reflected free-space optical target signal are collinearly passed through the nonlinear crystal 52 within the PSA 50.

The optical probe signal is frequency shifted relative to the local oscillator signal and the free-space optical target signal so that it can be discriminated from the signal return in the frequency spectrum domain. Adjusting a relative phase between the local oscillator signal and the amplified quadrature of the PSA 50 so that the optical probe signal signature may be always maximized ensures that the local oscillator signal is interrogating the amplified quadrature of the PSA 50, which allows for optimal performance.

In the illustrated embodiment, the reflected free-space optical target signal is frequency shifted from the local oscillator signal. The frequency shift is 50 kHz, for example, which allows the reflected free-space optical target signal to be brought out of the baseband noise and into a spectral window where the optical sensing system 10 is shot-noise limited. As noted above, the frequency shift may be done within the transmitter 20 prior to transmission of the optical signal, or inside the receiver 40 before the reflected free-space optical target signal reaches the combined 46.

This frequency shift causes the reflected free-space optical target signal to cycle in and out of phase with the local oscillator signal at a rate of 50 kHz, but the local oscillator signal is used to only measure that portion of the signal with which it is in phase. To see the signal-to-noise (SNR) improvements afforded by the PSA 50, the local oscillator signal may interrogate only that portion of the combined optical signal which is amplified by the PSA 50. Measuring the de-amplified quadrature of the PSA 50 would not yield an SNR improvement.

To interrogate only the amplified quadrature, the local oscillator signal may have a specific phase relationship with the amplified quadrature of the PSA 50. The phase relationship is measured by passing the optical probe signal through the non-linear crystal 52, collinearly with the pump beam and the reflected free-space optical target signal return.

As will be shown, this "common mode" approach has the advantage of assuring that the same phase relationship between the PSA 50 and the local oscillator signal exists for all signals. The use of the optical probe signal to align the amplifying quadrature of the PSA 50 to that of the homodyne detector 60 may also assure the same condition results for the reflected free-space optical target signal, even though the reflected free-space optical target signal and the optical probe signal have no particular relationship to one another.

When the relative phase between the optical probe signal and the local oscillator signal is such that the amplification of the optical probe signal is maximized, this may ensure that only that quadrature of the optical probe signal which has been amplified by the PSA 50 is being measured. This means that the amplified quadrature of any other signals which pass through the PSA 50 (i.e., the reflected free-space optical target signal) will be detected. This does not mean, however, that these other signals will have, at any given instant in time, some component in the amplified quadrature of the PSA. It only means that when the signal is in the amplified quadrature, it will be measured.

To mathematically demonstrate these phase relationships, a point in the optical sensing system 10 is selected to define a phase reference. All other phase measurements will be relative to this point. This reference is at the same frequency as the source laser within the transmitter 20 and is placed arbitrarily at the input to the non-linear crystal 52 within the PSA 50. The local oscillator signal is then projected back to this point. This is valid because the reflected free-space optical target signal and the optical probe signal experience a common path after being combined prior to the PSA 50, and they are at very nearly the same wavelength (separated by 40 kHz) as each other and the local oscillator signal.

The phase of the reflected free-space optical target signal relative to that of the pump beam at the input of the non-linear crystal 52 determines whether the reflected free-space optical target signal will be amplified or de-amplified. This relative phase can be written as follows:

$$\phi_1(t) = \omega_s t + \phi_s(t) - \phi_{pump}(t), \quad (1)$$

where $\omega_s$ is the angular frequency offset applied to the reflected free-space optical target signal, $\phi_s$ is the random temporal drift in the phase of the reflected free-space optical target signal, and $\phi_{pump}$ is the phase of the pump beam at the input to the non-linear crystal 52. Note that $\phi_s$ and $\phi_{pump}$ drift slowly in time, going through a full $2\pi$ of phase at some average frequency much less than the frequency offsets applied to the optical signal and the optical probe signal. For maximum PSA 50 gain, $\phi_1$ equals zero (or $\pi$), which it does approximately every 10 μs because of the 50 kHz frequency offset applied to the optical signal.

Similarly, the phase of the reflected free-space optical target signal relative to the local oscillator signal is defined as follows:

$$\phi_2(t)=\omega_s t+\phi_s(t)-\phi_{LO}(t)-\phi_0, \tag{2}$$

where $\phi_{LO}$ is the phase of the slowly varying local oscillator signal at the beam splitter 62 within the detector 60 which combines the local oscillator signal and the reflected free-space optical target signal, and $\phi_0$ is the (virtual) phase accumulated by back-propagating the local oscillator signal to the input of the non-linear crystal 52. For maximum signal amplitude at the output of the balanced detector, $\phi_2$ is equal to $\pi/2$ (or $-\pi/2$), which it also does approximately every 10 μs. For optimal detection performance, $\phi_1$ and $\phi_2$ equal their optimal values (zero or $\pi$, and $\pi/2$ or $-\pi/2$, respectively) at the same time, so that optimal detection occurs simultaneously with optimal phase-sensitive amplification.

For this to occur, the following relationship is to be satisfied:

$$\phi_2(t)-\phi_1(t)=\phi_{pump}(t)-\phi_{LO}(t)-\phi_0=\pi/2 \text{ or } -\pi/2. \tag{3}$$

The phase difference between the pump beam and the local oscillator signal cannot be measured directly, but using the optical probe signal allows this relationship to be inferred.

Similar to equations (1) and (2), the relative phase between the optical probe signal and the pump beam and the local oscillator signal can be written as follows:

$$\phi'_1(t)=\omega_{probe}t+\phi_{probe}(t)-\phi_{pump}(t)$$

$$\phi'_2(t)=\omega_{probe}t+\phi_{probe}(t)-\phi_{LO}(t)-\phi_0, \tag{4}$$

where for the optical probe signal to be maximized, $\phi'_1$ and $\phi'_2$ equal their optimal values (zero or $\pi$, and once again, for optimal amplification and detection of $\pi/2$ or $-\pi/2$, respectively) at the same time.

Therefore, if the signature (i.e., amplitude) of the optical probe signal can be kept maximized, this ensures the proper phase relationship between the pump beam and the local oscillator signal, as described below:

$$\phi'_2(t)-\phi'_1(t)=\phi_{pump}(t)-\phi_{LO}(t)-\phi_0=\pi/2 \text{ or } -\pi/2. \tag{5}$$

This ends up being exactly the same phase relationship as that described in Equation 3, that the pump beam and local oscillator phase difference is at/2 or $-\pi/2$. In other words, if the optical probe signal can be kept at a maximum, it means that the local oscillator signal is interrogating the amplified quadrature not only of the optical probe signal, but also of the reflected free-space optical target signal. This is a direct consequence of implementing a common mode approach to integrating the PSA 50, assuring that the optical probe signal and the reflected free-space optical target return signal both experience common phase conditions for alignment of the PSA gain quadrature and the local oscillator signal detection quadrature.

The approach for locking the pump beam to the local oscillator signal will now be discussed in greater detail. This approach uses the optical probe signal to continuously monitor the phase relationship between the local oscillator signal and the amplified quadrature of the PSA 50. The optical probe signal is frequency shifted with respect to the local oscillator signal at a frequency different from that of the reflected free-space optical target signal.

In observing the subsequent power spectrum (with the pump beam for the PSA 50 turned off), the power measured in the optical probe signal remains fairly constant at some level. When the pump beam is turned on, the measured power of the optical probe signal begins to fluctuate randomly due to changes in the relative phase between the local oscillator signal and the amplified quadrature of the PSA 50. When the local oscillator signal is observing the amplified quadrature of the PSA 50, the measured power becomes large. When the local oscillator signal observes the de-amplified quadrature, the measured power is low. This variation in observed power with the change in the relative phase between the pump beam and the local oscillator signal can be approximated as follows:

$$P_p=A\cos^2(\Delta\phi), \tag{6}$$

where $P_p$ is the spectral domain power in the probe signal and $\Delta\phi$ is the deviation from the ideal relative phase relationship between the local oscillator signal and the amplified quadrature of the PSA 50.

When $\Delta\phi=0$, the local oscillator signal observes the amplified quadrature, and when $\Delta\phi=\pi/2$, the local oscillator signal observes the de-amplified quadrature. While viewing the output of the detector 60, the spectral power ($P_p$) of the optical probe signal cycles from high to low and back to high at a varying rate approximately between 0.5 Hz and 5 Hz, for example. A small sinusoidal path length modulation (phase modulation) can therefore be applied to the pump beam using a piezoelectric transducer (PZT) mirror 54 to derive an error signal that can then be used to maintain $\Delta\phi=0$.

Generation of the sinusoidal phase modulation of pump beam and of the error term will now be discussed. Applying a sinusoidal phase modulation to the pump beam would yield a spectral domain power level of the optical probe beam as follows:

$$P_p=A\cos^2(B\sin(\omega t)+\Delta\phi), \tag{7}$$

where B is the amplitude (in radians) of the phase modulation applied to the pump beam and $\omega$ is the angular frequency of that modulation.

Assuming that B and $\Delta\phi$ are small and keeping only terms of the Taylor series up to second order gives the following:

$$P_p \approx A[1-(B^2\sin^2(\omega t)+2B\sin(\omega t)\Delta\phi+\Delta\phi^2)]. \tag{8}$$

If $P_p$ is multiplied by $\sin(\omega t)$ and then integrated over an integer number of periods, all terms go to zero except for the $-2AB\sin(\omega t)\Delta\phi$ term. When this term is multiplied by $\sin(\omega t)$ and integrated over an integer number of periods, the following error term is obtained:

$$E \approx -ABt\Delta\phi \tag{9}$$

This error term is proportional to the phase error and indicates the direction in which a phase correction needs to be applied. The phase correction is applied by adjusting the bias voltage to the PZT mirror 54 to drive the error term to zero. For this scheme to work properly, the phase drift and other sources of noise may be significantly slower than the sinusoidal modulation frequency so that a reliable error term can be generated. Also, this approach depends upon the ability to synchronize the PZT drive signal, $B\sin(\omega t)$, with the sinusoidal multiplication term, $\sin(\omega t)$.

Referring back to FIG. 1, the illustrated receiver 40 is able to thus lock the phase of the local oscillator signal to the amplified quadrature of the PSA 50. The local oscillator signal is split by the optical splitter 42. The optical probe signal is generated by passing the split local oscillator signal through a phase modulator 44, which applies a frequency offset. The optical probe signal is then combined with the reflected free-space optical target signal at the optical combiner 46, which may be a 90:10 fiber splitter, for example. The output of the splitter includes 90% of the reflected free-space optical target signal and 10% of the optical probe signal.

The phase of the PSA 50 relative to the local oscillator signal is adjusted via a mirror 54 attached to a PZT. The optical probe signal and the reflected free-space optical target signal are then mixed with the local oscillator signal and detected within the balanced homodyne detector 70. Since the frequency offset of the optical probe signal is different from that of the reflected free-space optical target signal, its signature occurs at a different location in the power spectrum plot than that of the signal return, as illustrated in FIG. 3.

Since the optical probe signal has constant power, performance of the PSA 50 can be continuously monitored. This allows the proper phase relationship to be maintained between the local oscillator signal and the amplified quadrature of the PSA 50, even if the reflected free-space optical target signal is not present.

Figure 4:
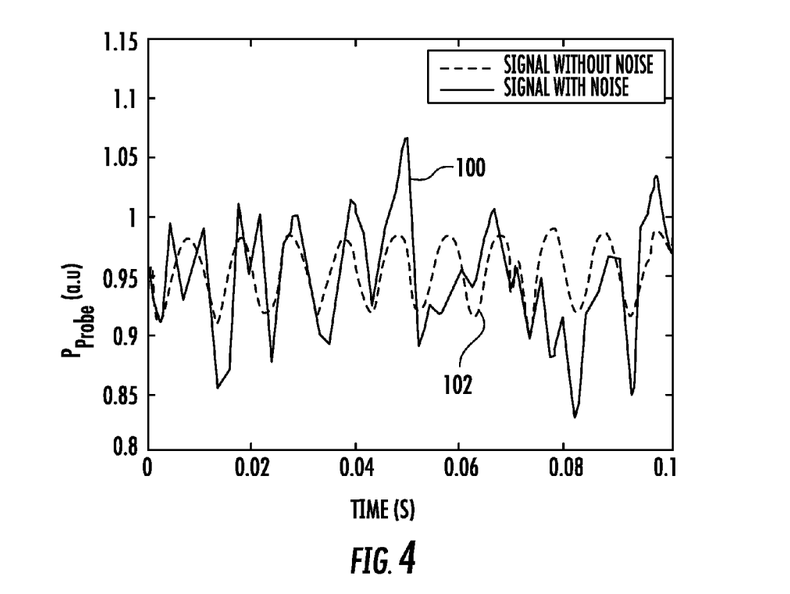
FIG. 4 is a power spectrum plot as a function of time of the optical probe signal when a sinusoidal modulation is applied to the relative phase between the local oscillator signal and the pump beam in accordance with the present invention.
Figure 5:
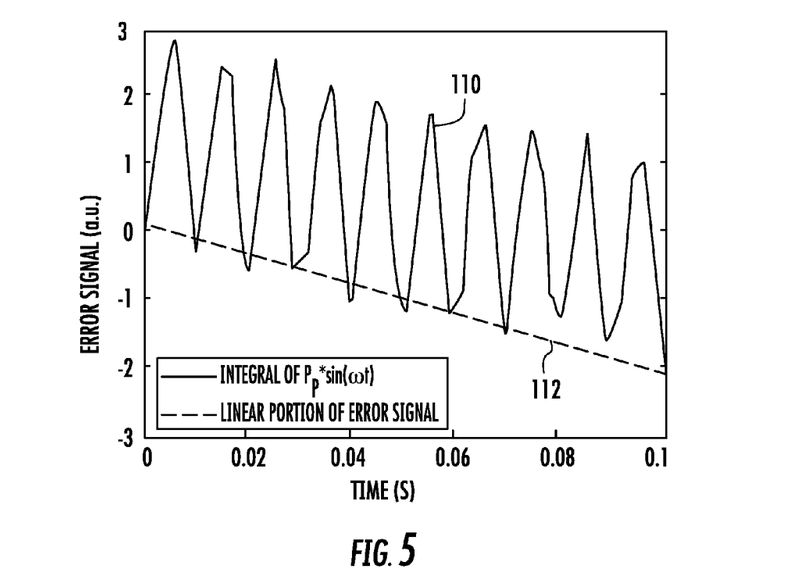
FIG. 5 is a power spectrum plot as a function of time of the error signal that is proportional to the phase offset between the local oscillator signal and the amplified quadrature of the PSA in accordance with the present invention.

Referring now to FIGS. 4 and 5, performance simulations will now be discussed. FIG. 4 provides a simulation of the peak of the optical probe signal in the power spectral domain as a function of time when a 100 Hz sinusoidal modulation is applied to the relative phase between the local oscillator signal and the pump beam. The data points are generated at a rate of 464 Hz, which realistically represents the speed with which these samples will be taken.

The amplitude of the phase modulation is 0.1 radians, and the phase error is given by $\Delta\phi=0.2$ radians. The dashed line 100 shows what the signal would look like if no noise were present, whereas the solid line 102 shows the signal with added zero mean Gaussian noise with a standard deviation of 0.05.

The error signal that is generated by multiplying the data in FIG. 4 by a 100 Hz sinusoid and integrating the result in time is provided in FIG. 5. The solid line 110 shows the cumulative integration of the power of the optical probe signal multiplied by the sinusoid. The dashed line 112 shows the only term that does not integrate to zero over an integer number of periods, i.e., the error term.

The dashed line 112 is the one being integrated. The error term grows with time and is proportional to the phase offset between the local oscillator and the amplified quadrature of the PSA 50. This error term is then fed back into the DC bias voltage on the PZT mirror 54 to slightly adjust the relative phase back to a point where the error term is zero.

Figure 6:
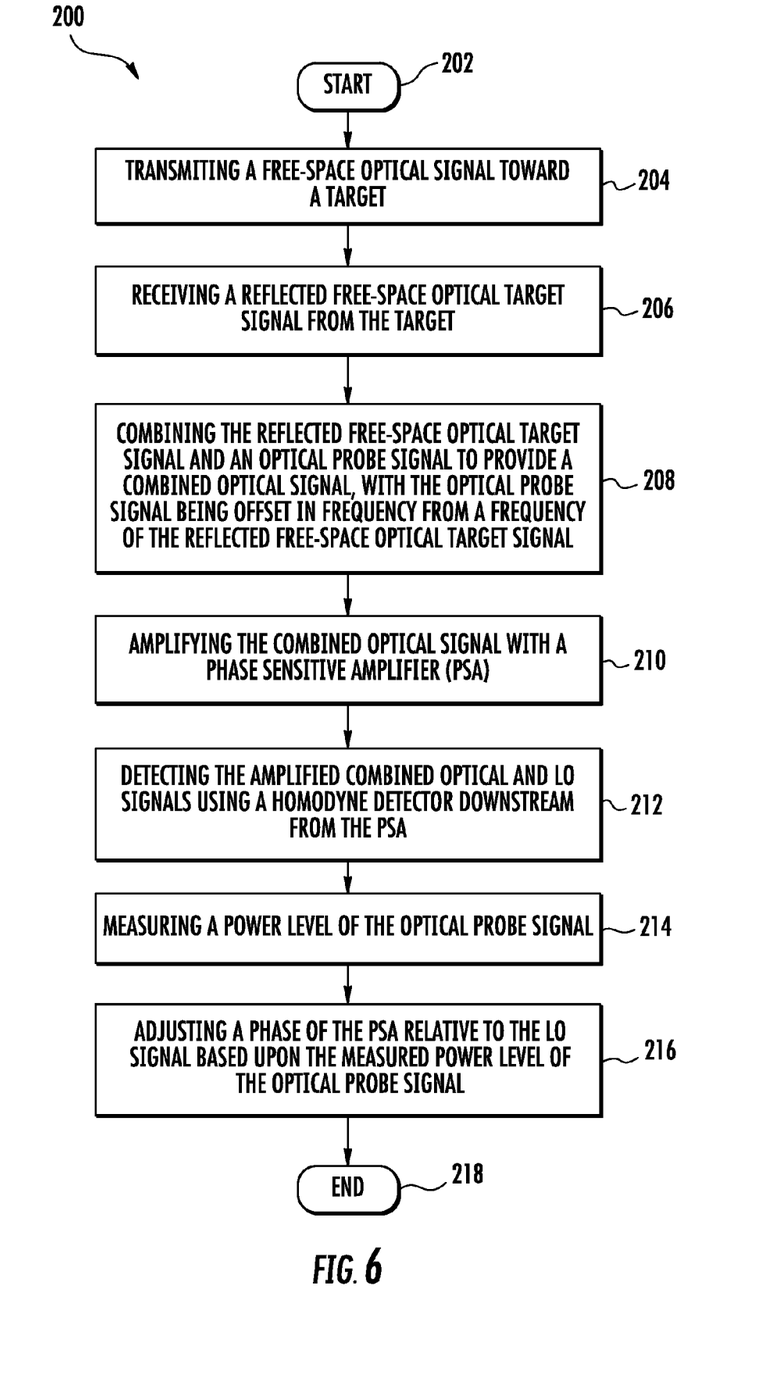
FIG. 6 is a flowchart illustrating a method for operating an optical sensing system in accordance with the present invention.

A flowchart 200 illustrating a method for operating an optical sensing system 10 will now be discussed in reference to FIG. 6. From the start (Block 202), the method comprises transmitting a free-space optical signal toward a target 30 at Block 204, and receiving a reflected free-space optical target signal from the target 30 at Block 206.

The method further comprises combining the reflected free-space optical target signal and an optical probe signal to provide a combined optical signal at Block 208, with the optical probe signal being offset in frequency from a frequency of the reflected free-space optical target signal. The combined optical signal is amplified with a PSA at Block 210. The amplified combined optical signal and a local oscillator signal are detected at Block 212 using a homodyne detector coupled downstream from the PSA 50. A power level of the combined optical signal is measured at Block 214, and a phase of the PSA 50 relative to the local oscillator signal is adjusted based upon the measured power level of the optical probe signal at Block 216. The method ends at Block 218.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An optical sensing system comprising:
   a transmitter configured to transmit a free-space optical signal toward a target; and
   a receiver configured to receive a reflected free-space optical target signal from the target, said receiver comprising
   a phase sensitive amplifier (PSA),
   a homodyne detector coupled downstream from said PSA, and
   a controller configured to adjust a phase of said PSA based upon said homodyne detector.

2. The optical sensing system according to claim 1 further comprising:
   a combiner configured to combine the reflected free-space optical target signal and an optical probe signal to provide a combined optical signal, with the optical probe signal being offset in frequency from a frequency of the reflected free-space optical target signal; and
   said PSA being configured to periodically amplify the combined optical signal in an amplifying quadrature and periodically de-amplify the combined optical signal in a de-amplifying quadrature based on the phase of said PSA.

3. The optical sensing system according to claim 2 wherein the optical probe signal has a known phase and amplitude.

4. The optical sensing system according to claim 2 further comprising a frequency shifter configured to provide the optical probe signal by shifting a frequency of a local oscillator signal.

5. The optical sensing system according to claim 4 wherein said controller is configured to measure a power level of the optical probe signal, and to adjust the phase of said PSA relative to the local oscillator signal based on the measured power level.

6. The optical sensing system according to claim 2 wherein said homodyne detector is configured to generate a detected signal by combining the combined optical signal with a local oscillator signal; and wherein said controller is configured to measure a power level of the optical probe signal in the detected signal, and to adjust the phase of said PSA relative to the local oscillator signal based upon the measured power level so that measurement of the optical probe signal is in the amplifying quadrature of said PSA.

7. The optical sensing system according to claim 6 wherein said homodyne detector comprises:
   a beam splitter configured to split the local oscillator signal and to split the combined optical signal; and
   at least one photodiode downstream from said beam splitter and configured to provide the detected signal based on receiving the split local oscillator signal and the split combined optical signal.

8. The optical sensing system according to claim 6 wherein said homodyne detector is configured as a balanced detector.

9. The optical sensing system according to claim 1 wherein said PSA comprises:
   a non-linear crystal; and a pump beam generator configured to generate a pump beam to amplify the combined optical signal.

10. An optical sensing system comprising:
a receiver configured to receive a reflected free-space optical target signal from a target, said receiver comprising
a combiner configured to combine the reflected free-space optical target signal and an optical probe signal to provide a combined optical signal, with the optical probe signal being offset in frequency from a frequency of the reflected free-space optical target signal,
a phase sensitive amplifier (PSA) coupled downstream from said combiner,
a homodyne detector coupled downstream from said PSA, and
a controller configured to measure a power level of the optical probe signal, and to adjust the phase of said PSA based on the measured power level.

11. The optical sensing system according to claim 10 wherein said PSA is configured to periodically amplify the combined optical signal in an amplifying quadrature and periodically de-amplify the combined optical signal in a de-amplifying quadrature based on the phase of said PSA.

12. The optical sensing system according to claim 10 wherein the optical probe signal has a known phase and amplitude.

13. The optical sensing system according to claim 10 further comprising a frequency shifter configured to provide the optical probe signal by shifting a frequency of a local oscillator signal.

14. The optical sensing system according to claim 13 wherein said controller is configured to adjust the phase of said PSA relative to the local oscillator signal based on the measured power level.

15. The optical sensing system according to claim 11 wherein said homodyne detector is configured to generate a detected signal by combining the combined optical signal with a local oscillator signal; and wherein said controller is configured to measure the power level of the optical probe signal in the detected signal, and to adjust the phase of said PSA relative to the local oscillator signal based upon the measured power level so that measurement of the optical probe signal is in the amplifying quadrature of said PSA.

16. The optical sensing system according to claim 15 wherein said homodyne detector comprises:
a beam splitter configured to split the local oscillator signal and to split the combined optical signal; and
at least one photodiode downstream from said beam splitter and configured to provide the detected signal by receiving the split local oscillator signal and the split combined optical signal.

17. The optical sensing system according to claim 15 wherein said homodyne detector is configured as a balanced detector.

18. The optical sensing system according to claim 10 wherein said PSA comprises:
a non-linear crystal; and
a pump beam generator configured to generate a pump beam to amplify the combined optical signal.

19. A method for operating an optical sensing system comprising:
transmitting a free-space optical signal toward a target; and
operating a receiver to receive a reflected free-space optical target signal from the target, the operating comprising
amplifying the reflected free-space optical target signal with a phase sensitive amplifier (PSA),
detecting the amplified reflected free-space optical target signal using a homodyne detector coupled downstream from the PSA, and
operating a controller to adjust a phase of the PSA based upon the detected amplified reflected free-space optical target signal.

20. The method according to claim 19 further comprising:
combining the reflected free-space optical target signal and an optical probe signal to provide a combined optical signal, with the optical probe signal being offset in frequency from a frequency of the reflected free-space optical target signal; and
wherein the amplifying comprises periodically amplifying the combined optical signal in an amplifying quadrature and periodically de-amplify the combined optical signal in a de-amplifying quadrature based on the phase of the PSA.

21. The method according to claim 20 wherein the optical probe signal has a known phase and amplitude.

22. The method according to claim 20 further comprising shifting a frequency of a local oscillator signal to provide the optical probe signal.

23. The method according to claim 22 wherein operating the controller comprises measuring a power level of the optical probe signal, and to adjust the phase of the PSA relative to the local oscillator signal based on the measured power level.

24. The method according to claim 20 wherein using the homodyne detector generates a detected signal by combining the combined optical signal with a local oscillator signal; and
wherein operating the controller comprises measuring a power level of the optical probe signal in the detected signal, and to adjust the phase of the PSA relative to the local oscillator signal based upon the measured power level so that measurement of the optical probe signal is in the amplifying quadrature of the PSA.

25. The method according to claim 24 wherein the homodyne detector comprises a beam splitter configured to split the local oscillator signal and to split the combined optical signal; and at least one photodiode downstream from the beam splitter and configured to provide the detected signal based on receiving the split local oscillator signal and the split combined optical signal.

26. The method according to claim 24 wherein the homodyne detector is configured as a balanced detector.

27. The method according to claim 19 wherein the PSA comprises a non-linear crystal, and a pump beam generator configured to generate a pump beam to amplify the combined optical signal.

* * * * *